(12) United States Patent
Miller et al.

(10) Patent No.: US 9,223,593 B2
(45) Date of Patent: Dec. 29, 2015

(54) EFFICIENT DISTRIBUTION OF FUNCTIONAL EXTENSIONS TO A 3D MODELING SOFTWARE

(71) Applicant: TRIMBLE NAVIGATION LIMITED, Sunnyvale, CA (US)

(72) Inventors: Tyler Miller, Denver, CO (US); John M. Bacus, Boulder, CO (US)

(73) Assignee: Trimble Navigation Limited, Sunnyvale, CA (US)

( * ) Notice: Subject to any disclaimer, the term of this patent is extended or adjusted under 35 U.S.C. 154(b) by 339 days.

(21) Appl. No.: 13/676,304

(22) Filed: Nov. 14, 2012

(65) Prior Publication Data
US 2013/0124700 A1 May 16, 2013

Related U.S. Application Data

(60) Provisional application No. 61/560,086, filed on Nov. 15, 2011.

(51) Int. Cl.
*G06F 15/177* (2006.01)
*G06F 9/445* (2006.01)
(Continued)

(52) U.S. Cl.
CPC ........... *G06F 9/44526* (2013.01); *G06F 3/1225* (2013.01); *G06F 8/20* (2013.01); *G06F 8/71* (2013.01); *G06F 17/50* (2013.01)

(58) Field of Classification Search
CPC ......... G06F 8/20; G06F 8/71; G06F 17/5004; G06F 17/5009; G06F 17/50; G06F 3/1225; G06F 9/44526
USPC ......... 709/205, 224; 717/105, 104; 703/1, 13; 713/168; 715/760
See application file for complete search history.

(56) References Cited

U.S. PATENT DOCUMENTS 6,469,239 B1 10/2002 Fukuda
6,552,721 B1 4/2003 Ishikawa
(Continued)

FOREIGN PATENT DOCUMENTS

EP 2256626 12/2010
JP 2004-260274 9/2004
(Continued)

OTHER PUBLICATIONS

International Search Report and Written Opinion for International (PCT) Patent Application No. PCT/US2012/064890, mailed Mar. 26, 2013 9 pages.
(Continued)

*Primary Examiner* — Dustin Nguyen
(74) *Attorney, Agent, or Firm* — Sheridan Ross P.C.

(57) ABSTRACT

Functional extensions are provided for use with a modeling software. The functional extensions provide functionality not otherwise provided by the modeling software. The functional extensions are received from a client device by a server and stored in a database. Thereafter, the server transmits the functional extensions to a second client device, sometimes in response to receiving a request for the functional extension from the second client device. The server may update a user profile to indicate that a functional extension was received from a user operating the client device and, additionally, may transmit the functional extension to the second client device when the server receives an indication that the user is operating the second client device.

31 Claims, 11 Drawing Sheets

(51) Int. Cl.
*G06F 9/44* (2006.01)
*G06F 17/50* (2006.01)
*G06F 3/12* (2006.01)

(56) References Cited

U.S. PATENT DOCUMENTS

| | | |
|---|---|---|
| 7,827,546 B1 | 11/2010 | Jones et al. |
| 7,831,517 B1 | 11/2010 | Vijay et al. |
| 2002/0107750 A1 | 8/2002 | Kanevsky et al. |
| 2002/0154174 A1 | 10/2002 | Redlich et al. |
| 2003/0074323 A1 | 4/2003 | Catan |
| 2003/0084343 A1 | 5/2003 | Ramachandran et al. |
| 2003/0228146 A1 | 12/2003 | Fortin et al. |
| 2004/0064696 A1* | 4/2004 | Daigle et al. ............ 713/168 |
| 2004/0107085 A1* | 6/2004 | Moosburger et al. ......... 703/13 |
| 2004/0239679 A1 | 12/2004 | Ito et al. |
| 2006/0090005 A1 | 4/2006 | Wu |
| 2007/0011273 A1 | 1/2007 | Greenstein et al. |
| 2008/0015823 A1* | 1/2008 | Arnold et al. ................... 703/1 |
| 2008/0141334 A1 | 6/2008 | Wicker et al. |
| 2008/0229234 A1 | 9/2008 | Astolfi et al. |
| 2008/0281839 A1 | 11/2008 | Bevan et al. |
| 2008/0301771 A1 | 12/2008 | Kawai et al. |
| 2008/0319925 A1 | 12/2008 | Herold et al. |
| 2008/0320607 A1 | 12/2008 | Richardson |
| 2009/0276318 A1 | 11/2009 | Broadbent et al. |
| 2010/0013842 A1 | 1/2010 | Green et al. |
| 2010/0045670 A1 | 2/2010 | O'Brien et al. |
| 2010/0118039 A1 | 5/2010 | Labour |
| 2010/0135552 A1 | 6/2010 | Leib et al. |
| 2010/0257451 A1 | 10/2010 | Halevi et al. |
| 2010/0312596 A1 | 12/2010 | Saffari et al. |
| 2010/0312879 A1 | 12/2010 | Taieb |
| 2011/0057929 A1 | 3/2011 | Chen et al. |
| 2011/0078801 A1 | 3/2011 | Bae |
| 2011/0137437 A1 | 6/2011 | Jonsson |
| 2011/0214075 A1* | 9/2011 | Vongphouthone et al. ... 715/760 |
| 2011/0231274 A1 | 9/2011 | Joao |
| 2012/0089960 A1* | 4/2012 | Medvidovic et al. ......... 717/105 |
| 2012/0331061 A1* | 12/2012 | Lininger ...................... 709/205 |
| 2013/0002647 A1* | 1/2013 | Bacus et al. .................. 345/419 |
| 2013/0120378 A1 | 5/2013 | Miller et al. |
| 2013/0120770 A1 | 5/2013 | Mandel et al. |
| 2013/0124155 A1 | 5/2013 | Miller et al. |
| 2013/0125029 A1 | 5/2013 | Miller et al. |
| 2013/0202197 A1 | 8/2013 | Reeler et al. |

FOREIGN PATENT DOCUMENTS

| | | |
|---|---|---|
| KR | 10-0595506 | 7/2006 |
| KR | 10-2009-0041204 | 4/2009 |
| WO | WO 2008/157639 | 12/2008 |

OTHER PUBLICATIONS

International Preliminary Report on Patentability for International (PCT) Patent Application No. PCT/US2012/64890, mailed May 30, 2014 8 pages.
International Search Report for International (PCT) Patent Application No. PCT/US2012/64884, mailed Mar. 25, 2013 3 pages.
International Preliminary Report on Patentability for International (PCT) Patent Application No. PCT/US2012/064884, mailed May 30, 2014 8 pages.
International Search Report for International (PCT) Patent Application No. PCT/US2012/064928, mailed Mar. 22, 2013 3 pages.
International Preliminary Report on Patentability for International (PCT) Patent Application No. PCT/US2012/064928, mailed May 30, 2014 8 pages.
International Search Report for International (PCT) Patent Application No. PCT/US2012/064939, mailed Mar. 19, 2013 2 pages.
International Preliminary Report on Patentability for International (PCT) Patent Application No. PCT/US2012/064939, mailed May 30, 2014 8 pages.
Berndt et al. "3D Modeling in a Web Browser to Formulate Content-Based 3D Queries," Proceedings of the 14th International Conference on 3D Web Technology, ACM, Jun. 16-17, 2009, 8 pages.
Extended Search Report for European Patent Application No. 12849865.6, dated Feb. 4, 2015 6 pages.
Official Action for U.S. Appl. No. 13/676,298, mailed Nov. 10, 2014 14 pages.
Official Action for U.S. Appl. No. 13/675,770, mailed Aug. 25, 2014 26 pages.
Official Action for U.S. Appl. No. 13/675,770, mailed Jan. 22, 2015 27 pages.
Official Action for U.S. Appl. No. 13/676,335, mailed Mar. 6, 2015 56 pages.

* cited by examiner

EFFICIENT DISTRIBUTION OF FUNCTIONAL EXTENSIONS TO A 3D MODELING SOFTWARE

CROSS REFERENCE TO RELATED APPLICATIONS

This application claims the benefit of U.S. Provisional Patent Application No. 61/560,086, filed on Nov. 15, 2011, entitled "Efficient Distribution of Functional Extensions to a 3D Modeling Software," the disclosure of which is hereby expressly incorporated herein by reference.

FIELD OF THE DISCLOSURE

This disclosure relates to three-dimensional modeling software and, in particular, to providing functional extensions to such software via a network-connected server.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Today, professional as well as non-professional users in a variety of different fields, such as engineering, architecture, automotive design, graphic design, advertising, fashion design, medicine, etc., can develop three-dimensional (3D) models of buildings, vehicles, and other objects using 3D modeling software that operates on a computing device. A user typically interacts with 3D modeling software via input devices such as a keyboard, mouse, trackball, and/or stylus, and the drafting document is displayed on a graphical display device, such as a computer monitor or screen.

Partially as a result of the many ways in which 3D modeling software is used by different people, it is often difficult for a software manufacturer to incorporate features that satisfy the specific needs of every individual user or every group of users. One way of mitigating these unmet needs is for the manufacturer to expose at least some of the functionality and data structures of the software to an Application Programming Interface (API) function. An API defines the rules and specifications for a software program so that other programs can be designed to use the various resources of that program. In other words, the API operates as an interface between programs. Using the API, users may add functionality to the 3D modeling software according to their specific needs to augment controls, drawing functions, application "skins," and other aspects of the 3D modeling software.

SUMMARY

In an embodiment, a method in a network server extends the functionality of modeling software. The method includes receiving a functional extension to the modeling software from a first client device via the communication network. The functional extension includes computer-readable instructions compatible with the modeling software and provides a modeling function not provided by the modeling software. The method stores the functional extension in a database. The method also includes receiving from a second client device, via the communication network, a request to provide the functional extension. In response to receiving the request, the method provides the functional extension to the second client device.

In a further embodiment, a method in a network server extends the functionality of modeling software. The method includes receiving a functional extension to the modeling software from a first client device operated by a registered user via a communication network. The functional extension includes computer-readable instructions compatible with the modeling software and provides a modeling function not provided by the modeling software. The method also includes storing the functional extension in a database. Further, the method includes updating a record associated with the registered user in a profile server, including storing an indication that the functional extension was received from the registered user. The method also includes receiving an indication that the registered user is operating a second client device and providing the functional extension to the second client device.

In another embodiment, a tangible, computer-readable medium stores instructions, executable by a processor to perform a method in a network server for extending functionality of modeling software. The instructions are operable to cause the processor to receive a functional extension to the modeling software from a first client device via a communication network. The functional extension includes computer-readable instructions compatible with the modeling software and provides a modeling function not provided by the modeling software. The instructions are also operable to store the functional extension in a database. The instructions further include instructions operable to cause the processor to receive from a second client device, via the communication network, a request to provide the functional extension. The instructions also cause the processor to, in response to receiving the request, provide the functional extension to the second client device.

In yet another embodiment, a tangible, computer-readable medium stores instructions, executable by a processor to perform a method in a network server for extending functionality of modeling software. The instructions are operable to cause the processor to receive a functional extension to the modeling software from a first client device operated by a registered user via a communication network. The functional extension includes computer-readable instructions compatible with the modeling software and provides a modeling function not provided by the modeling software. The instructions are also operable to cause the processor to store the functional extension in a database and update a record associated with the registered user in a profile server, including storing an indication that the functional extension was received from the registered user. The instructions also cause the processor to receive an indication that the registered user is operating a second client device, and provide the functional extension to the second client device.

In still another embodiment, a method in a network server extends the functionality of modeling software. The method includes storing in a database a functional extension to the modeling software. The functional extension includes computer-readable instructions compatible with the modeling software, and provides a modeling function not provided by the modeling software. The method also includes receiving a request from a first client device operated by a first user to provide the functional extension via the communication network. In response to receiving the request, the method provides the functional extension to the first client device. The method also provides the functional extension to a second client device operated by the first user.

The figures depict a preferred embodiment of the present invention for purposes of illustration only. One skilled in the art will readily recognize from the following discussion that alternative embodiments of the structures and methods illustrated herein may be employed without departing from the principles of the invention described herein.

DETAILED DESCRIPTION

In embodiments described below, a networked system permits one or more users to access user-created functionality of a 3D modeling software program on one or more client devices operating on a local area network (LAN) or a wide area network (WAN). A client device may be a workstation, a desktop computer, a laptop computer, a netbook computer, a tablet computer, a smart phone, a personal digital assistant, etc. A user may write computer-executable instructions (e.g., in the form of an executable script), referred to herein as "extensions," to provide added functionality to the 3D modeling software, which may interface with the 3D modeling software through an API. The user may upload the created extensions to a server, which may store the extensions in a database, also connected to the network. The server allows the user, and/or one or more other users, to retrieve from the database and download the extension at a later time and/or on a different client device.

In some embodiments, the server stores and/or accesses one or more profiles for each user. The profiles include a record for each user of the extensions the user has downloaded and/or installed. In this manner, the 3D modeling software may contact the server and download and install the extension(s) associated with the user profile, regardless of the client device on which the user happens to be running the 3D modeling software.

In some embodiments, the server implements a marketplace for extensions, allowing users to upload and sell extensions they have created. The server stores in a user's profile the extensions that the user has uploaded, purchased, downloaded, etc., and the 3D modeling software automatically downloads and installs the extensions associated with a profile when the user runs the 3D modeling software.

In some embodiments (which may overlap with the embodiments described above), the 3D modeling software operates within a browser application, for example as instructions in a scripting language or as a plug-in. A user installs the plug-in and is able to operate the basic functionality of the 3D modeling software within the browser. Additionally, the plug-in is operable to contact the server and download one or more of the extensions stored on the database according to a profile associated with the user. Thereafter, the plug-in incorporates the extension into the operation of the 3D modeling software.

Figure 1:
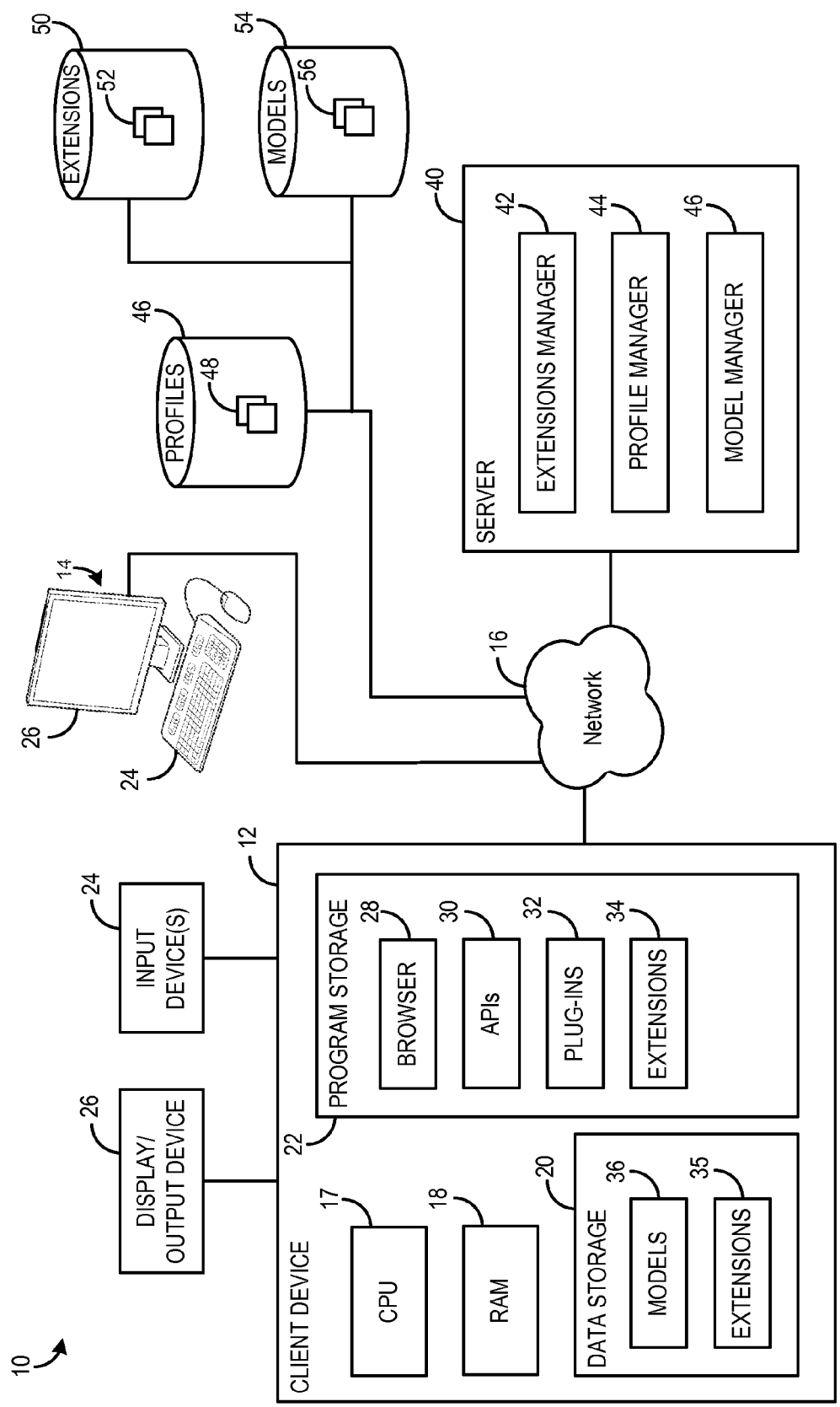
FIG. 1 is a block diagram of a communication system in which techniques of the present disclosure are utilized to efficiently distribute functional extensions for a three-dimensional (3D) modeling software.

FIG. 1 depicts a block diagram of an embodiment of a system 10 for efficient distribution of functional extensions in a 3D modeling application. The system 10 includes a client device 12, another client device 14 that operates independently of the client device 12, and a communication network 16 to which the client devices 12 and 14 are communicatively coupled. As described above, each of the client devices 12, 14 may be a workstation, a desktop computer, a laptop computer, a netbook computer, a tablet computer, a smart phone, a personal digital assistant, etc. Although the client devices 12 and 14 include similar hardware, software, and/or firmware components, for ease of illustration, the components of only the client device 12 are shown in FIG. 1.

The client device 12 in some embodiments includes a central processing unit (CPU) 17 to execute computer-readable instructions, a random access memory (RAM) unit 18 to store data and instructions during operation, program storage 22 including persistent memory to store software applications, shared software components such as Dynamic-link Libraries (DLLs), and other programs executed by the CPU 17, and data storage 20 including persistent memory to store data used by the programs stored in the program storage 22. By way of example, the data storage 20 and the program storage 22 may be implemented on a hard disk drive (HDD) coupled to the CPU 17 via a bus. Generally speaking, the components 17, 18, 20, and 22 may be implemented in any suitable manner. For instance, while depicted in FIG. 1 as a single unit, the processor 17 may be one or more processors in one or more physical packages, may be either a single-core or a multi-core processor, or may be a general processing unit and a graphics processor. Additionally, the processor 17 may be split among one or more sub-systems of the client device 12, such as might be the case in a workstation having both a general purpose processor and a graphics subsystem including a specialized processor. Of course, the processor 17 may be or include one or more field-programmable gate arrays (FPGAs), digital signal processors (DSPs), and/or application-specific integrated circuits (ASICs).

In the example implementation of FIG. 1, the client device 12 is a personal computer (PC). However, in general, the client device 12 may be any suitable stationary or portable computing device such as a tablet PC, a smart phone, etc. Although the computing device 12 in the example of FIG. 1 includes both storage and processing components, the client device 12 in other embodiments can be a so-called thin client that depends on another computing device for certain computing and/or storage functions. For example, in one such embodiment, the data storage 20 and the program storage 22 are external to the computing device 12 and are connected to the client device 12 via a network link. Further, the client device 12 may be coupled to an input device 24 and an output device 26. The input device 24 may include, for example, a pointing device such as a mouse, a keyboard, a touch screen, a trackball device, a digitizing tablet, or a microphone, and the output device 26 may include an LCD display monitor, a touch screen, or another suitable output device. Using the input device 24 and the output device 26, a user can access a graphical user interface (GUI) of the client device 12.

In operation, a user operating the client device 12 uses a 3D modeling software application to develop a model of an object or a group of objects. In an embodiment, the 3D modeling software is a stand-alone application stored in the program storage 22 and executable by the CPU 17. In another embodiment, the 3D modeling software is a software plug-in (i.e., a software component adding the 3D modeling functionality to a stand-alone software application) executable by the CPU 17 in conjunction with another software application. Specifically, the 3D modeling software is a software plug-in executable by the CPU 17 in conjunction with a web browser. With reference to FIG. 1, the program storage 22 is depicted as storing a browser application 28 and a plug-in 32, enabling the execution in the browser 28 of the 3D modeling functionality. That is, the plug-in 32 includes a set of instructions executable on the CPU 3QCPU 17 from within the executing web browser 28. Generally speaking, the 3D modeling application plug-in 32 provides a set of modeling controls to generate, position, and variously adjust three-dimensional shapes, apply textures to the shapes or surfaces, define interactions between shapes, etc. Models developed using the plug-in 32 may be stored as files 36 on a computer-readable medium, such as the data storage 20.

According to some embodiments, the 3D modeling software, whether implemented as a stand-alone application or as the plug-in 32, includes an interface via which certain functionality and data structures of the 3D modeling software are made accessible to other programs, so that the functionality of the 3D modeling software may be extended to include additional features. In an embodiment, one or more Application Programming Interfaces (APIs) 30 provide interfaces to the 3D modeling software (e.g., the plug-in 32) and/or the browser 28. In FIG. 1, the browser 28 and the plug-in 32 cooperate to implement the 3D modeling software. As described below with reference to FIG. 2, the APIs 30 may include APIs serving different interface roles. In any event, the APIs may be stored as instructions in the program storage 22 of the client device, or may be integrated in the 3D modeling software. The APIs 30 cooperatively enable a user operating the client device 12 to develop one or more extensions to augment or extend the functionality of the 3D modeling software. By way of example, a user may develop a single-command interface (e.g., a button, keystroke, etc.) that draws a 3D shape not specifically provided for by the 3D modeling software (e.g., a cube with a triangular opening in one of the faces). As another example, a user may modify the look and feel of the 3D modeling application by creating a "skin." The extensions created by a user may be stored as extensions 34 in the program storage 22 and/or may be stored as extensions 35 in the data storage 20.

The APIs 30 may also cooperate with the plug-in 32 and the browser 28 to allow a user to interact with a server 40 via the network 16. With continued reference to FIG. 1, the server 40 includes software (i.e., computer-readable instructions stored on or embodied in a tangible device and executable as hardware or by a stand-alone processor) implementing an extensions manager 42 and a profile manager 44, each of which is described in greater detail below. Briefly, the profile manager facilitates the management of one or more user profiles 48 in a database 46, while the extensions manger 42 facilitates the storage and retrieval from a database 50 of extensions 52. The server 40 may also include a model manager 46, facilitating the storage and retrieval of models 56 from a database 54. As depicted in FIG. 1, the databases 46, 50, and 54 are each communicatively coupled to the server 40 via the network 16.

A first embodiment of the 3D modeling software is described with reference to FIG. 2A, which depicts a technology stack 60 representing an implementation of the system 10. The technology stack 60 generally includes a client side 62 implemented as a browser and a server side 64 implementing one or more server modules 90. The client side 62 has three primary layers: a user interface (UI) layer 66, an API layer 68, and a 3D modeling engine layer 70. In the depicted embodiment, the 3D modeling software is implemented as a plug-in 82 associated with a web browser (e.g., the browser 28). The plug-in, which includes a modeling engine 88, forms the 3D modeling engine layer 70. An API 78 in the API layer 68 exposes functionality and/or data structures of the 3D modeling engine 88. For example, in an embodiment, the 3D modeling engine 88 is implemented in the JavaScript® scripting language, and the API 78 is a JavaScript® API. The UI layer 66 is implemented using elements 72 of a conventional web programming language, such as a hypertext-markup language (HTML) and, in particular, the HTML5 language, and may implement one or more extensions 74, written in a scripting language (e.g., JavaScript®), and/or one or more web-based graphics libraries 76. The extensions 74 may correspond to the extensions 34, 35 for extending the functionality of (and/or the data available to) the 3D modeling software.

Figure 2A:
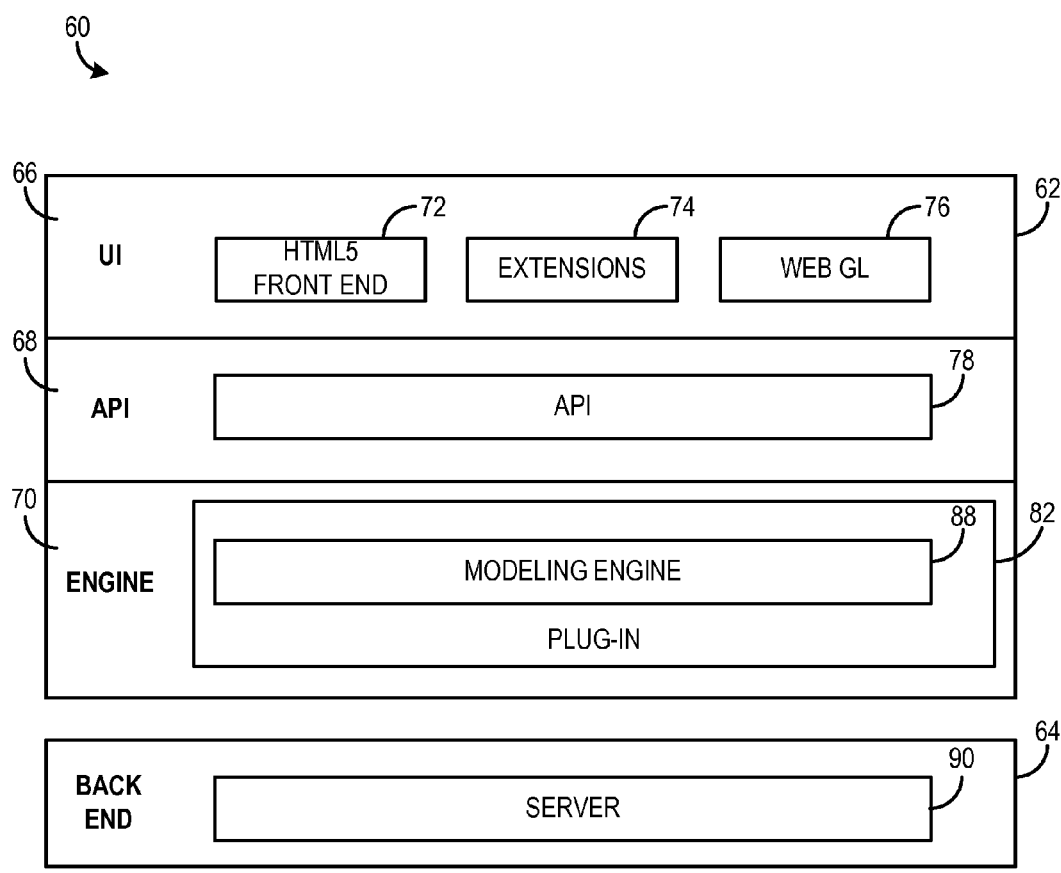
FIG. 2A depicts a layer diagram illustrating the functional layers of an embodiment of the system of FIG. 1.

In the embodiment depicted in FIG. 2A, the API 78 or the plug-in 82 may include functions for communicating with the server 40. Specifically, the API 78 or the plug-in 82 may include functions in the plug-in 82 or the API 78 (or for accessing functions of the browser) related to communicating with the extensions manager 42, the profile manager 44, and/or the model manager 46. The functions may include: sending authentication information (e.g., a profile user name and password), uploading a model 56, uploading an extension 52, downloading a model 56, downloading an extension 52, editing information (e.g., a list of installed extensions 52 and/or models 56) in a profile 48, sending an inventory of currently loaded extensions, or any other function necessary to implement the concepts described herein.

Figure 2B:
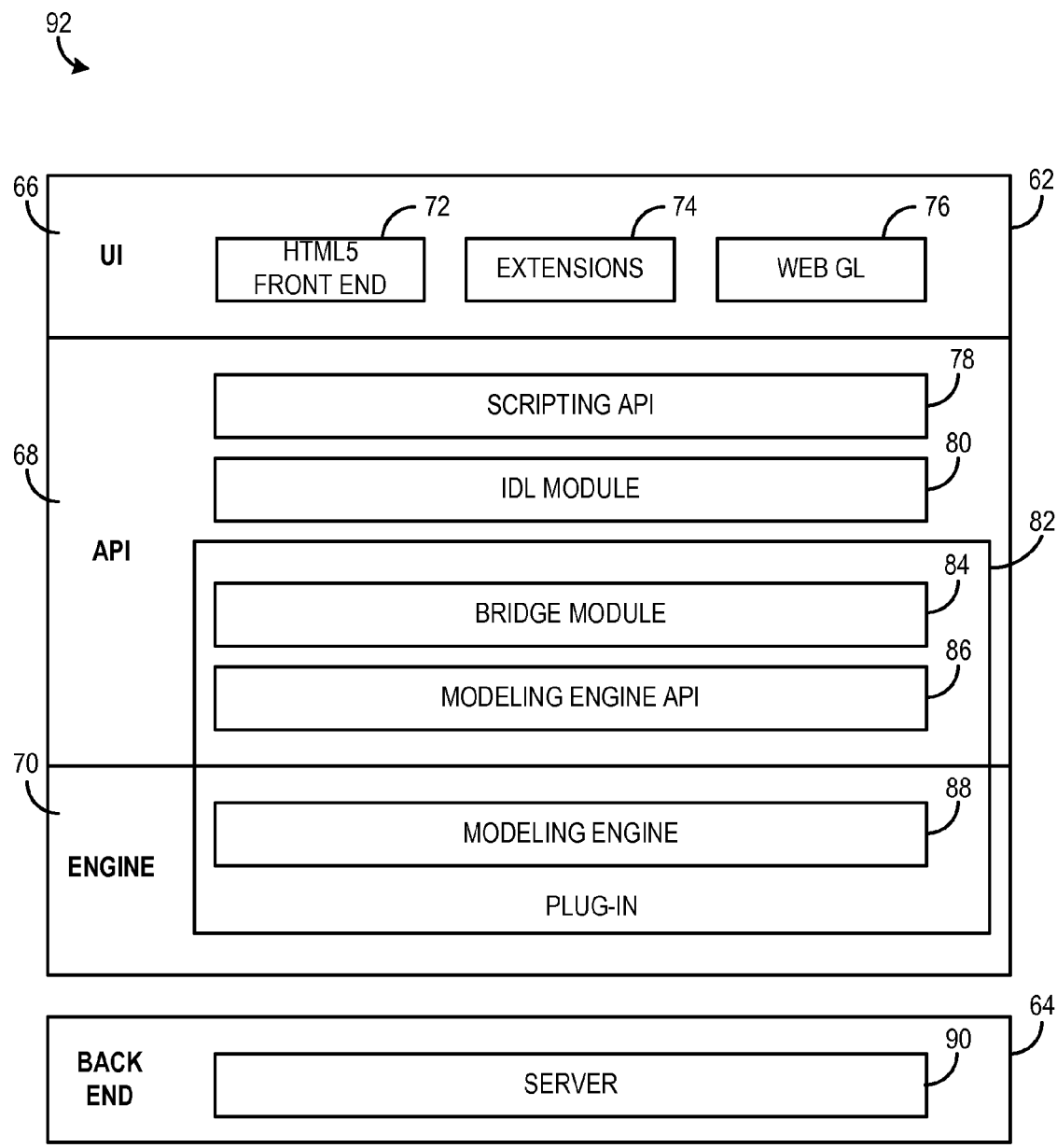
FIG. 2B depicts a second layer diagram illustrating the functional layers of another embodiment of the system of FIG. 1.

FIG. 2B depicts a technology stack 92 representing a second implementation of the system 10. In the technology stack 92, the 3D modeling software is once again implemented as a plug-in 82 associated with a web browser (e.g., the web browser 28). The plug-in includes a modeling engine 88 implemented in a first language, a modeling engine API 86 exposing functionality and/or data structures of the modeling engine 88 in the first language, and a bridge module 84 for enabling the plug-in 82 to operate with the browser 28. For example, in one embodiment, the modeling engine 88 is implemented in a high-level programming language, such as C++, as part of an ActiveX plug-in 82. The modeling engine API 86 is adapted to interface the C++ modeling engine 88 with the ActiveX plug-in 82, and the bridge module 84 is a set of ActiveX controls. In another embodiment, the modeling engine 88 is implemented in the high-level programming language (e.g., C++), as part of a Netscape Plug-in (NP) type plug-in 82 (known as an NP Runtime Plug-in). The modeling engine API 86 is adapted to interface the C++ modeling engine 88 with the NP Runtime Plug-in 82, and the bridge module 84 is a NP API. In yet another embodiment, the modeling engine 88 is implemented in the high-level programming language (e.g., C++), as part of a native client plug-in 82. The modeling engine API 86 is adapted to interface the C++ modeling engine 88 with the native client plug-in 82, and the bridge module 84 is specific to the native client (i.e., the browser 28).

The API layer 68 in the technology stack 92 also includes an API 78 exposing the functionality of the plug-in 82 to the UI layer 66 and, in particular, to the extensions 74. For example, in an embodiment, the API 78 may be a JavaScript® API, and the extensions 74 may be written in the JavaScript® scripting language.

If the bridge module 84 does not share a programming language with the API 78, the API layer 68 may additionally implement an interface description language module 80 describing the interface of the plug-in 82 (e.g., describing the bridge module 84).

Figure 2C:
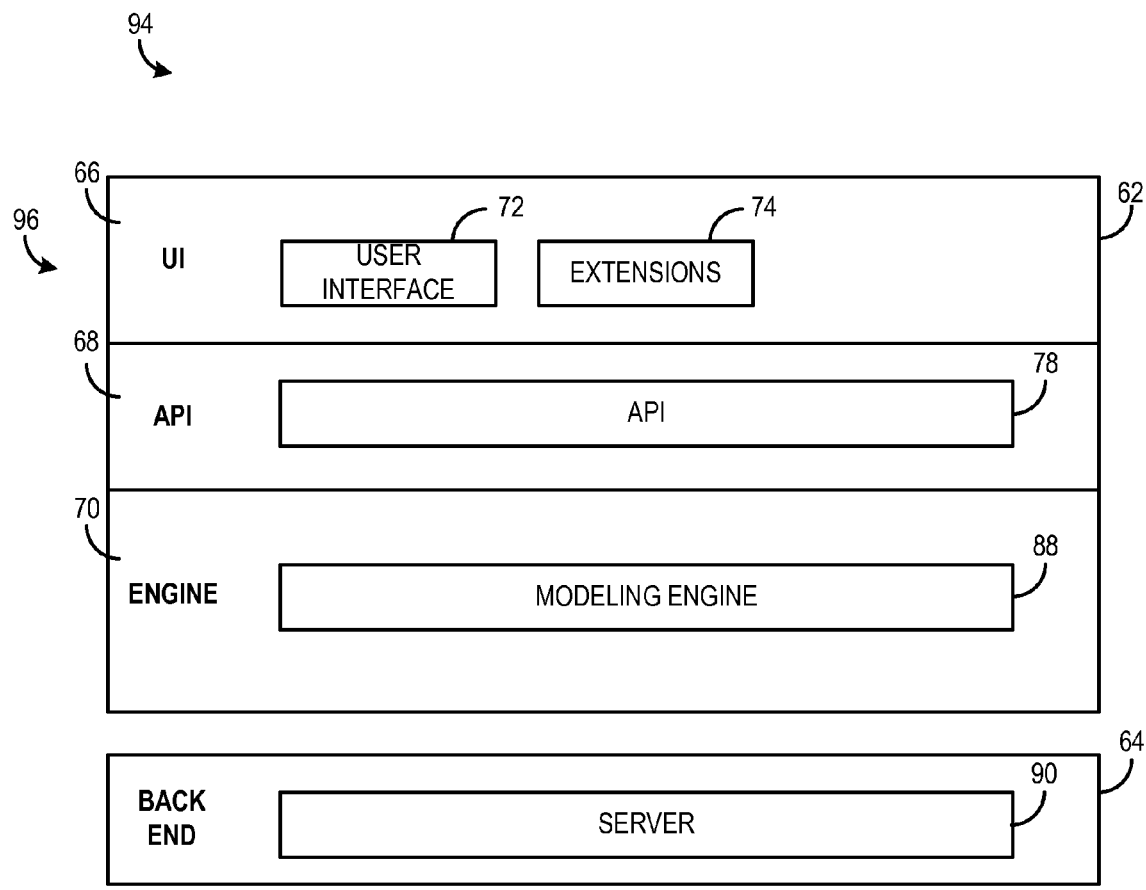
FIG. 2C depicts a third layer diagram illustrating the functional layers of still another embodiment of the system of FIG. 1.

FIG. 2C depicts a technology stack 94 representing a third implementation of the system 10. Like the technology stacks 60 and 92, the technology stack 94 is divided into the client side 62 and the server side 64. The client side 62 of the 3D modeling software is a stand-alone application 96, having the UI layer 66, the API layer 68, and the engine layer 70. According to some embodiments, the API layer 68 includes a single API 78 exposing functionality and/or data structures of the 3D modeling engine 88. The API 78 may be provided as a plug-in, e.g., a compiled software component which the user of the client device 12 may install to add collaboration functionality to the stand-alone application 96. In another embodiment, the API 78 may be provided as a non-optional component of the stand-alone application 96. In yet another embodiment, the API 52 is provided as a script interpreted by the stand-alone application 96 at runtime. In this embodiment, the script interacts with a general-purpose API for accessing the functionality to the stand-alone application 96. In other words, the API 78 may be provided as a "basic" script to which the extensions 74 may add further functionality. The script in some embodiments may be provided in an encrypted (or "scrambled") form recognized by the stand-alone application 96.

A user may create one or more extensions 74 by creating scripts conforming to the API 78. In an embodiment, the API 78 allows a set of instructions in a scripting language (i.e., a script or extension) interpretable by the 3D modeling engine 88 to access certain classes used by the 3D modeling engine 88 and invoke certain methods used by these classes. For example, one or several extensions 34, 35 that utilize the API 78 may be stored in the program storage 22 or the data storage 20, respectively. In an embodiment, the extensions 34, 35 are stored in a directory which the 3D modeling engine 88 is configured to automatically access in order to locate and load extension scripts, when available. During execution, a user may activate a GUI control that causes the 3D modeling engine 88 to interpret one of the extensions 34, 35 that invokes the API 78. For example, one of the extensions 34, 35 may provide a GUI control that, when activated, causes the 3D modeling engine 88 to draw a non-standard shape.

While the extensions 34, 35 may be stored in the program storage 22 and the data storage 20, the user (e.g., the user of the client device 12) may also want to share the extensions 34, 35 with others, or may want to have ready access to the extensions 34, 35 from a second client device (e.g., the client device 14). To that end, the system 10 may allow the user to upload the extensions 34, 35 to the server 40 via the network 16, and the server 40 may store the extensions 34, 35 in the database 50 as extensions 52. Through the server 40, the system 10 may likewise allow the user to search for, request, download, and install extensions 52 stored in the database 50, including the extensions 34, 35.

In an embodiment, the server 40 includes the extensions manager 42, the profile manager 44, and the model manager 46. The client 62 (e.g. the browser or stand-alone application) may transmit identification and authentication information over the network to the profile manager 44 operating on the server 40. The identification and authentication information may, in an embodiment, include a user name or an email address and a password. The profile manager 44 may receive the identification and authentication information and, if the identification is valid and authenticated, may recognize the user as having a profile 48 stored in the database 46. Alternatively, the profile manager 44 may allow a new user to create a profile 48 to be stored in the database 46.

Once the profile manager 44 has authenticated the user and associated the user with the user's profile 48, the profile manager 44 may communicate information from the user's profile to the extensions manager 42 and/or to the model manager 46. In an embodiment, the extensions manager 42 allows users to: search for extensions 52 stored in the extensions database 50; upload to the database 50 extensions 52, including descriptions of the extensions 52, version information about the extensions 52, and information about the versions of the 3D modeling software with which the extensions 52 are compatible; comment on extensions 52 in the database 50; download extensions 52 from the database 50; etc. The extensions manager 42 may also receive information from the profile manager 44 about a particular user (e.g., an authenticated user), and may receive from or transmit to the authenticated user extensions 52 according to the information, in an embodiment. For example, the extensions manager 52 may retrieve from the database 50 extensions 52 created by the user, may search for and retrieve from the database 50 extensions that were not created by the user, may allow the user to find and download from the database 50 one or more extensions 52 previously downloaded, etc. The extensions manager 42 may also update or cause to be updated the profile 52 of the authenticated user in some embodiments. In an embodiment, the extensions manager 42 may implement a method for commoditizing extensions 52, including buying extensions 52 created by users, selling extensions 52 to users, allowing users to sell/buy extensions 52 to/from other users, etc.

The model manager 46 may likewise receive information from the profile manager 44 about the particular user, and may receive from or transmit to the authenticated user models 56 according to the information. For example, the authenticated user may store in the database 54 models 56 created by the user, retrieve from the database 54 models 56 created by the user, search for and/or download models 56 from the database 54 (even if the user did not create the models 56), retrieve from the database 54 models 56 previously downloaded from the database 54, etc. In an embodiment, the model manager 46 may implement a method for commoditizing models 56, including buying models 56 from users, selling models 56 to users, allowing users to sell/buy models 56 to/from other users, etc.

Figure 3:
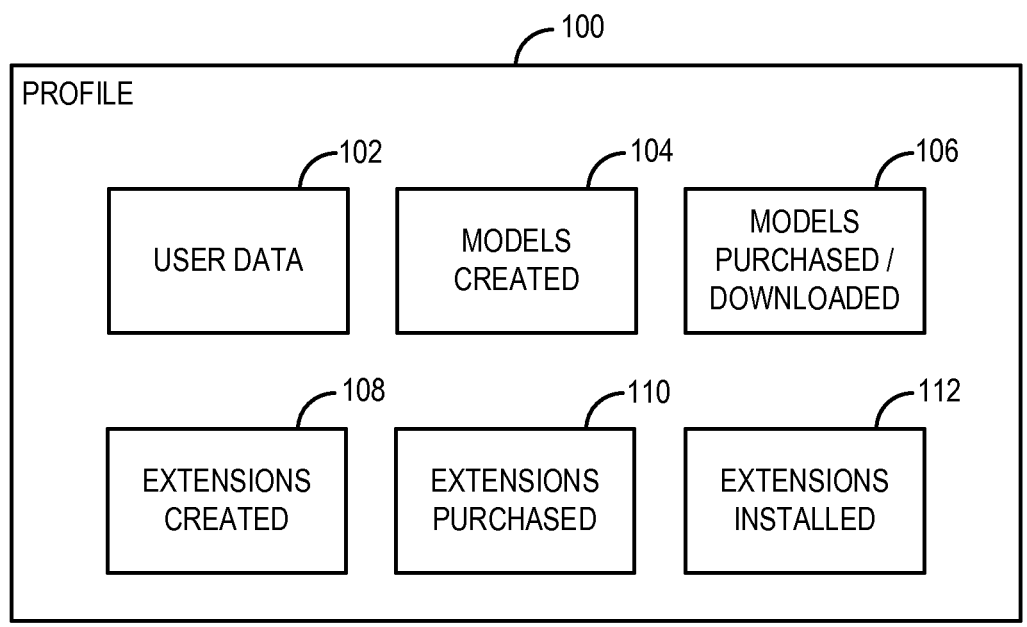
FIG. 3 is a block diagram representing a user profile according to a described embodiment.

FIG. 3 is a block diagram representing an exemplary user profile 100. In an embodiment, the profile 100 includes user data 102. The user data 102 may include personal information about the user, including the user's name, address, phone number, information about client devices associated with the user, etc. In an embodiment, the modeling software and/or one or more extensions associated with the modeling software and/or one or more models associated with the modeling software may be available according a subscription model. The subscription model may allow various service levels related to functionality of the modeling software, availability of updates, availability of one or more extensions, etc., according to the status of users as subscribers. Accordingly, the user data 102 may also include subscription data, indicating the user's subscription status (i.e., whether the user has a subscription, the type of subscription, when the subscription expires, etc.). The user data 102 may further include payment information, such as credit card information, used for subscription purposes and/or to purchase models 56 and/or extensions 52, in an embodiment.

In an embodiment, the profile 100 includes data 104 about models the user has created, and data 106 about models the user has purchased and/or downloaded. For example, a user may have unrestricted rights to download, edit, and/or share models that the user created, which models are identified in the data 104. Additionally, in an embodiment, the user may choose the rights associated with any particular model 56 that the user created, and the rights associated with each model 56 created by the user may be recorded in the data 104. The data 106, by comparison, may include records related to models 56 that the user has purchased from, for example, an online marketplace of models, or records related to models 56 that user has downloaded or to which the user has been given rights by the model's creator.

Of course, the profile 100 also includes data 108, 110, and 112 related to the extensions 52. For example, the profile 100 includes data 108 related to extensions created by the user. Like the models indicated by the data 104, the extensions indicated in the data 108 may be downloadable, editable, or sharable by the user because the user created the extensions. In an embodiment, the user may choose the rights associated with a particular extension 52 that the user created, and the rights associated with each extension 52 created by the user may be recorded in the data 108. The data 110 may record extensions 52 that the user has purchased, in embodiments implementing a marketplace for extensions (i.e., a means for users to buy and/or sell extensions 52).

It is not always necessary or desirable, however, for a user to have installed all of the extensions 52 that the user created (e.g., the extensions 52 indicated in the data 108) or the extensions 52 that the user downloaded and/or purchased (e.g., the extensions 52 indicated in the data 110). For example, a user may create an extension 52 solely for the purpose of selling it or making it otherwise available to other users, without the user choosing to install the extension 52 on the device on which the user runs the 3D modeling application. For this reason, in an embodiment the profile 100 additionally includes data 112 indicating extensions 52 that are currently installed on the user's client device. Thus, any particular extension 52 may be indicated in the data 108 as created by the user, but not indicated in the data 112 as installed to run on the user's client device. As a result, a user may experience a seamless transition between experiences on multiple client devices. That is, the user may install one or more extensions 52 to run with the client on the user's tablet computer (e.g., the client device 12), and the extensions may be automatically installed to run with the client on the user's desktop computer (e.g., the client device 14) upon the user logging into the user's profile.

Figure 4:
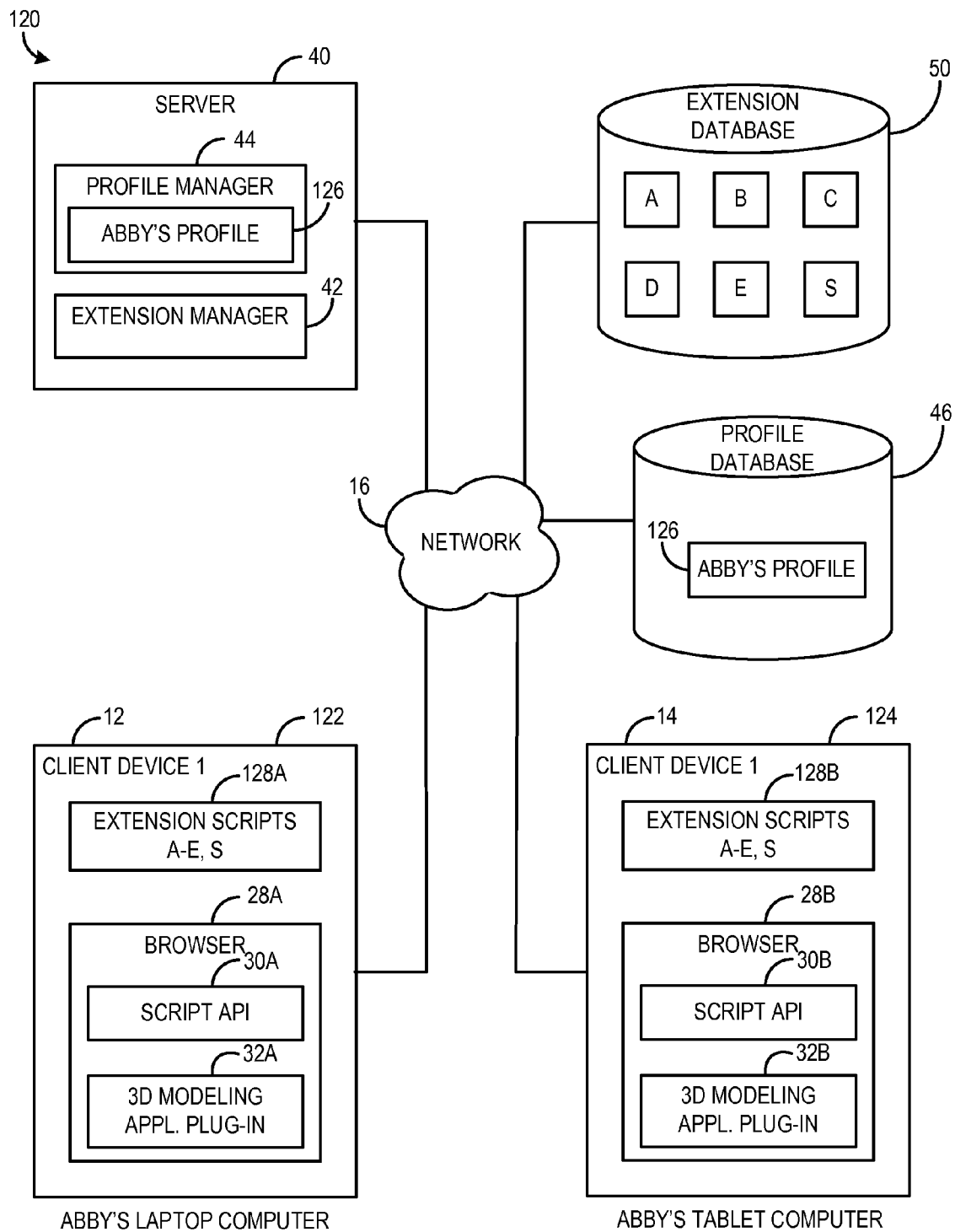
FIG. 4 is a block diagram illustrating an implementation of functional extension distribution.

FIG. 4 depicts a block diagram of an embodiment 120 of the system 10. A user, Abby, has as the first client device 12 a laptop computer 122 and as the second client device 14 a tablet computer 124. The laptop computer 122 has installed on it browser software 28A, which is configured to run an installed 3D modeling application plug-in 32A, and an installed API 30A for running extension scripts. Abby may enter her identification and authentication information into an interface of the plug-in 32A. The information may be transmitted from the laptop 122 to the server 40 and, in particular to the profile manager 44, which may receive the identification and authentication information and associate the laptop 122 with a profile 126 for Abby. Abby may execute a command associated with the plug-in 32A to contact the extension manager 42 on the server 40, and search for, download, and install a collection of extension scripts A, B, C, D, and E from the extensions database 50. The extensions A-E may be stored as extension scripts 128A on the laptop computer 122. Upon downloading the extension scripts A-E, the extension manager 42 may instruct the profile manager 44 to update Abby's profile 126 to indicate (e.g., in the data 110) that Abby has downloaded the extensions A-E and to indicate (e.g., in the data 112) that Abby has installed the extensions A-E.

Abby may also create an extension S, which may also be stored as one of the extension scripts 128A on the laptop computer 122. After creating the extension S, Abby may activate a control in the 3D modeling application plug-in 32A to upload the extension S to the extension database 50. Accordingly, the software may contact the extension manager 42 via the network 16 and transmit the extension S to the server 40 for storage in the database 50. The extension manager 42 may instruct the profile manager 44 to update Abby's profile 126 to indicate (e.g., in the data 108) that Abby has uploaded the extension S. If Abby installs the extension S on the laptop computer 122, the extension manager 42 may instruct the profile manager 44 to update Abby's profile to indicate (e.g., in the data 112) that Abby has installed the extension S. At the end of Abby's session using the laptop computer 122 (or after a time period, or immediately) the profile manager 44 may update Abby's profile 126 in the profile database 46.

Later, Abby may use her tablet computer 124. The tablet computer 124 has installed on it browser software 28B, which is configured to run an installed 3D modeling application plug-in 32B, and an installed API 30B for running extension scripts. Abby may enter her identification and authentication information into an interface of the plug-in 32B. The information may be transmitted from the tablet 124 to the server 40 and, in particular to the profile manager 44, which may receive the identification and authentication information and associate the tablet computer 124 with Abby's profile 126. The profile manager 44 may read the data 112 indicating that Abby has previously installed extensions A-E and S. In an embodiment, the profile manager 44 may request from the tablet computer 124 data indicating extensions 128B installed on the tablet computer, and may instruct the extension manager 42 to transmit to the tablet computer 124 any extensions indicated in the data 112 but not installed on the tablet computer 124. In another embodiment, the profile manager may send to the tablet computer 124 a list of extensions indicated in the data 112, and the tablet computer 124 may send a request for extensions not present among the extensions 128B. In response to the request, the extension manager 42 may transmit to the tablet computer 124 the requested extensions. For example, when Abby begins using the tablet computer 124, the extensions scripts 128B may include only the extension A. Upon receiving the data 112 from the profile manager 44 (indicating that extensions A-E and S are installed), the tablet computer 124 may request extensions B-E and S from the extension manager 42. Some or all of this process may occur without any intervention by Abby. That is, the process may be automatic and transparent to the user.

Figure 5:
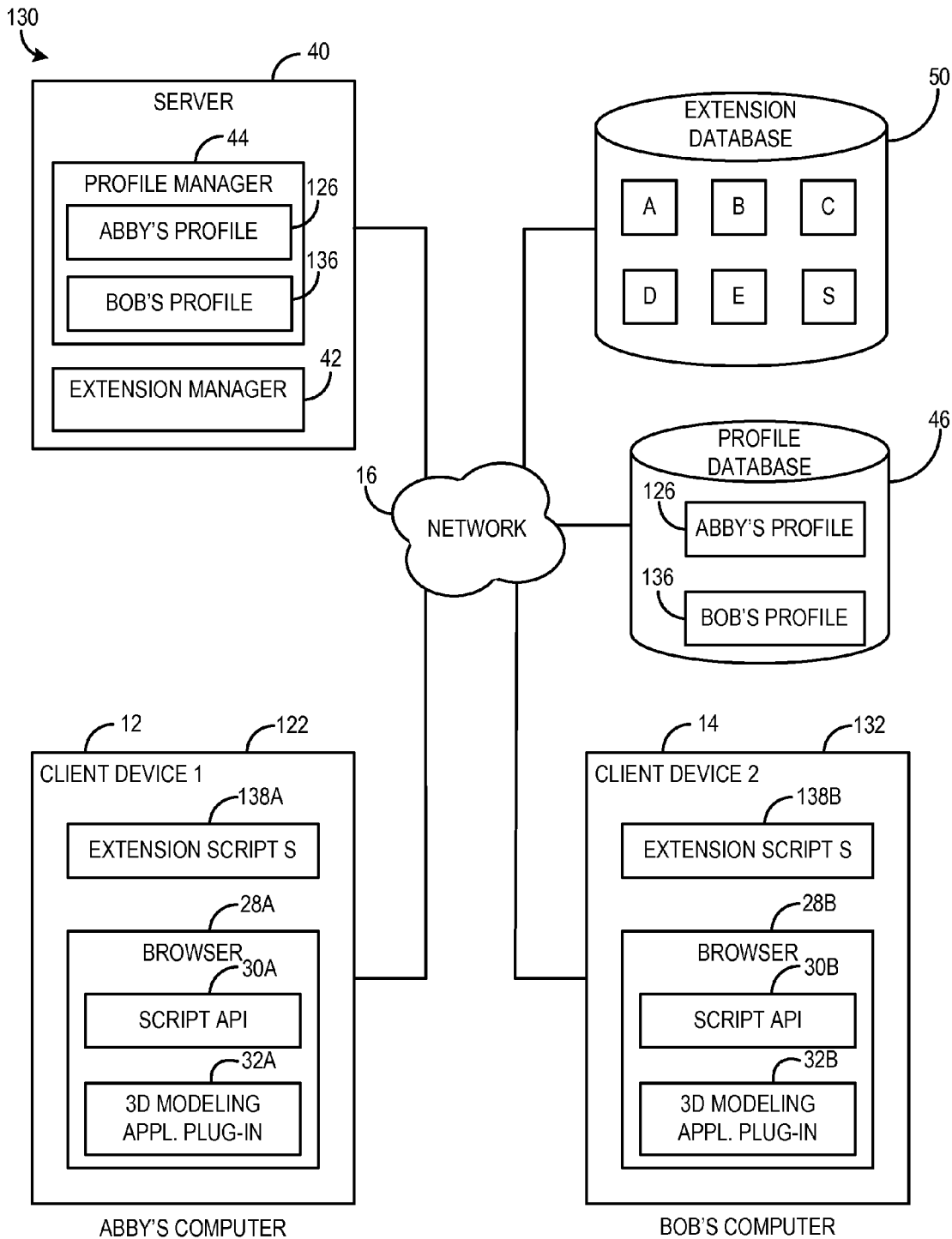
FIG. 5 is a block diagram illustrating a second implementation of functional extension distribution.

As described briefly above, the system 10 may also allow a first user to create and upload an extension 52 and a second user to download and install the extension 52. FIG. 5 depicts a block diagram of an embodiment 130 of the system 10. Abby, as before, has as the first client device 12 the computer 122. However, in FIG. 5, the second client device 14 is a computer 132 operated by Bob. Abby's computer 122 has installed on it the browser software 28A, configured to run the installed 3D modeling application plug-in 32A, and the installed API 30A for running extension scripts. Abby may enter her identification and authentication information into an interface of the plug-in 32A. The information may be transmitted from the computer 122 to the server 40 and, in particular to the profile manager 44, which may receive the identification and authentication information and associate the computer 122 with a profile 126 for Abby.

As before Abby may create the extension S, which may also be stored as an extension script 138A on the computer 122. After creating the extension S, Abby may activate a control in the 3D modeling application plug-in 32A to upload the extension S to the extension database 50. Accordingly, the software may contact the extension manager 42 via the network 16 and may transmit the extension S to the server 40 for storage in the database 50. The extension manager 42 may instruct the profile manager 44 to update Abby's profile 126 to indicate (e.g., in the data 108) that Abby has uploaded the extension S. If Abby installs the extension S on the computer 122, the extension manager 42 may instruct the profile manager 44 to update Abby's profile to indicate (e.g., in the data 112) that Abby has installed the extension S. In an embodiment, Abby may also indicate permissions associated with the extension S. For example, Abby may share the extension S with Bob. The extension manager 42 may update information associated with the extension S to indicate that Bob has permissions for the extension S or, in some embodiments, the profile manager 44 may update a profile 136 for Bob in the profile database 46 to indicate (e.g., in data 110) that Bob has permission to use the extension S. In another embodiment, Abby may place the extension S for sale, or may make it freely available to others.

Meanwhile, Bob may be using his computer 132. Bob's computer 132 has installed on it browser software 28B, which is configured to run the installed 3D modeling application plug-in 32B, and the installed API 30B for running extension scripts. Bob may enter his identification and authentication information into an interface of the plug-in 32B. The information may be transmitted from the computer 132 to the server 40 and, in particular to the profile manager 44, which may receive the identification and authentication information and associate the computer 132 with Bob's profile 136. The profile manager 44 may read the data 110 in Bob's profile 136 indicating that Abby has granted Bob permissions for the extension S. In an embodiment, the profile manager 44 may send a message to the browser 28B to indicate to Bob that Abby has granted permission to use the extension S, and asking Bob whether the extension S should be installed on the computer 132. In another embodiment, the browser 28B, perhaps in response to a request from Bob, presents a list of available extensions, including the extension S. Bob may then request the extension to be downloaded and installed to the computer 132. Accordingly, the extension manager 42 may cause the profile manager 44 to update Bob's profile 136 (e.g., the data 112) to reflect that Bob has installed the extension S on the computer 132.

Figure 6:
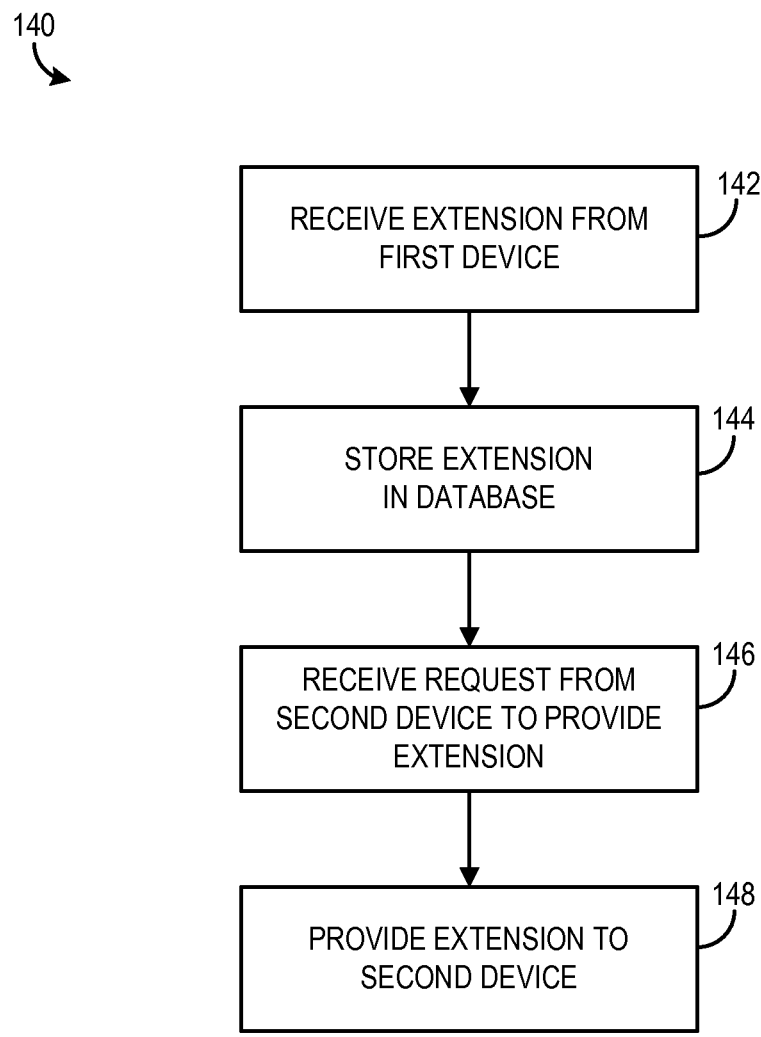
FIG. 6 is a flow chart depicting a method of distributing a functional extension according to presently described embodiments.

A set of machine-readable instructions, stored on a computer-readable medium (e.g., a memory device) and executable by a processor in the server 40, implements one or more methods for efficiently distributing functional extensions to a 3D modeling software. FIG. 6 is a flow chart illustrating one such method 140. In an embodiment, the method 140 allows distribution to one computer of an extension created at a second computer. For ease of description here and in the following paragraphs, when an action is performed by a processor of the server 40, the action will be attributed to the server 40. The server 40 receives an extension from a first device, such as the client device 12 (block 142). The server 40 stores the received extension in the database 50 (block 144). At a later time, the server 40 receives a request from a second device, such as the client device 14, to provide the extension (block 146). In response to the request, the server 40 provides the extension to the second device (block 148).

Figure 7:
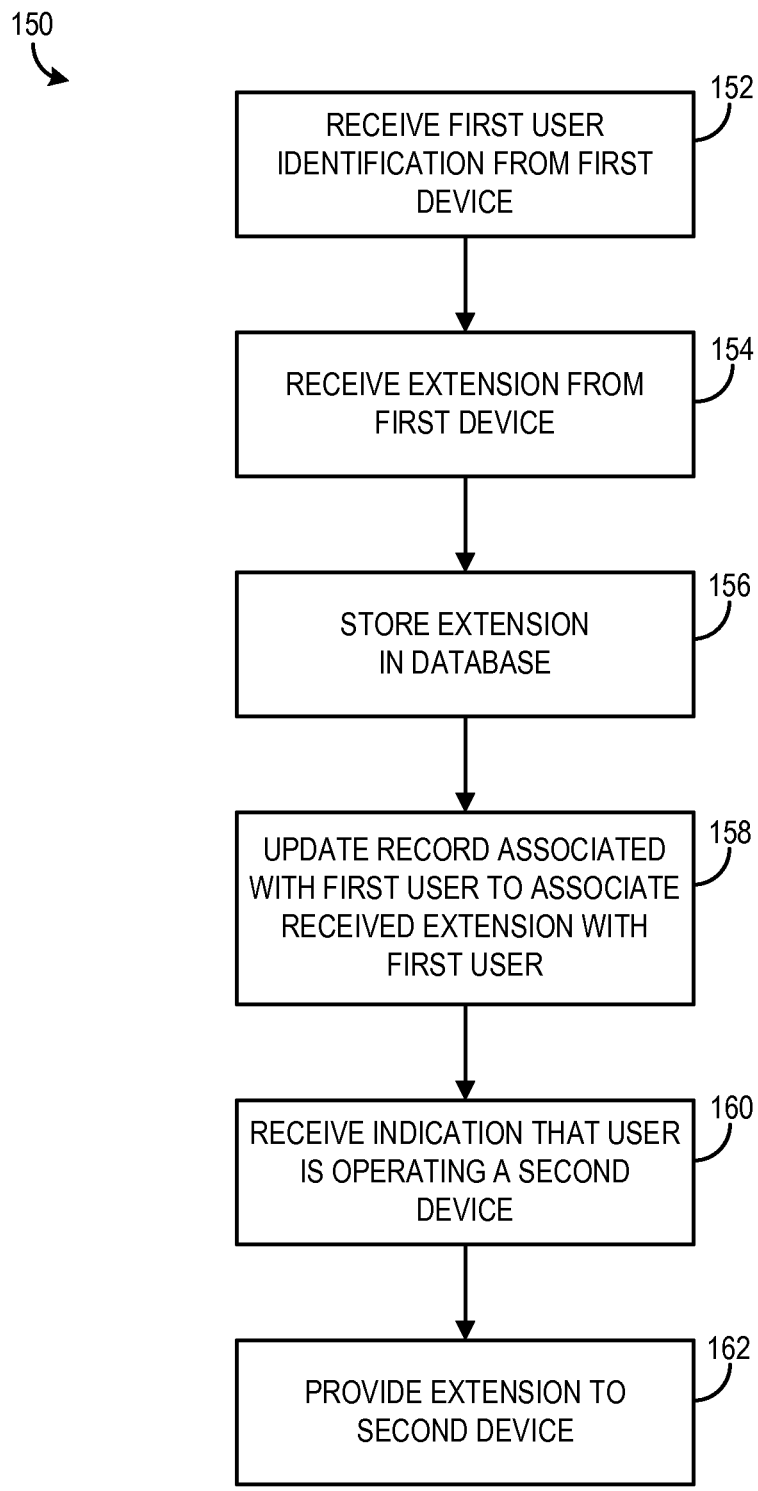
FIG. 7 is a flow chart depicting another method of distributing a functional extension according to presently described embodiments.

In another embodiment, a method 150, depicted in FIG. 7 as a flow diagram, allows transparent distribution of an extension between two client devices operated by the same user. The server receives a first user identification from a first device (e.g., the device 12) (block 152). The server 40 receives an extension from the first device (block 154) and stores the extension in the database 50 (block 156). The server 40 updates a record (e.g., the profile 48) associated with the user identification to associate the received extension with the first user (block 158). Thereafter, the server 40 receives an indication that the user is operating a second device (e.g., the device 14) (block 160). The server 40 provides the extension to the second device in response to receiving indication that the user is operating the second device (block 162).

Figure 8:
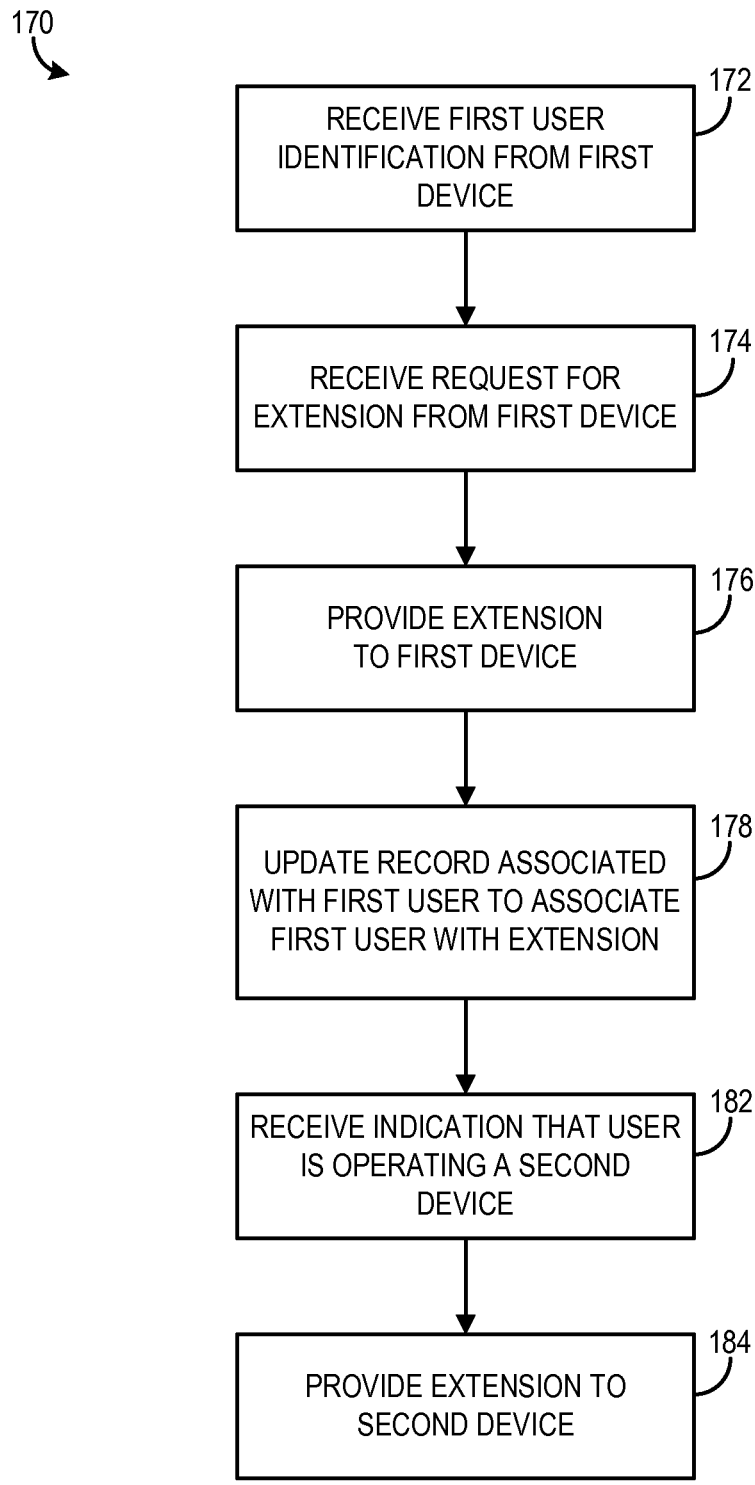
FIG. 8 is a flow chart depicting still another method of distributing a functional extension according to presently described embodiments.

FIG. 8 is a flow chart depicting still another embodiment of a method 170 of efficiently distributing functional extensions for a 3D modeling software. In contrast to the methods 140 and 150, the method 170 allows a user to have a seamless user experience across multiple devices. The embodiment depicted by the method 170 allows a user to install a functional extension on a first device and, when using a second device, have the functional extension automatically installed on the second device as well. Accordingly, in the method 170, the server 40 does not receive an extension from a first client device and providing the extension to a second client device. Instead, the server 40 receives a first user identification from a first device (e.g., the client device 12) (block 172). The server 40 also receives from the first device a request for an extension stored in the database 50 (block 174). The server 40 provides the extension to the first device (block 176) and updates a record (e.g., the profile 48) associated with the user identification to associate the received extension with the first user (block 178). Thereafter, the server 40 receives an indication that the user is operating a second client device (e.g., the client device 14) (block 182), and provides the extension to the second device (block 184).

In embodiments, the distribution of functional extensions may be implemented as an online store (i.e., a market place, sales outlet, etc.). That is, a user may upload to the server 40 a functional extension created by the user, and the functional extension may be distributed to other users who wish to purchase the functional extension. In some embodiments, the user may sell the functional extension to business entity operating the server 40 and the business entity may distribute the functional extension, collect payments from other users in exchange for the functional extension, and keep the payments collected. In other embodiments, the user may upload the functional extension to the server 40, and the business entity operating the server 40 may sell the functional extension to other users, keeping as a commission a portion of the payments received for the extension, and remitting the remainder of the payments received to the user that uploaded the extension to the server 40. In still other or overlapping embodiments, the functional extension may be distributed according to a subscription plan as described above.

Figure 9:
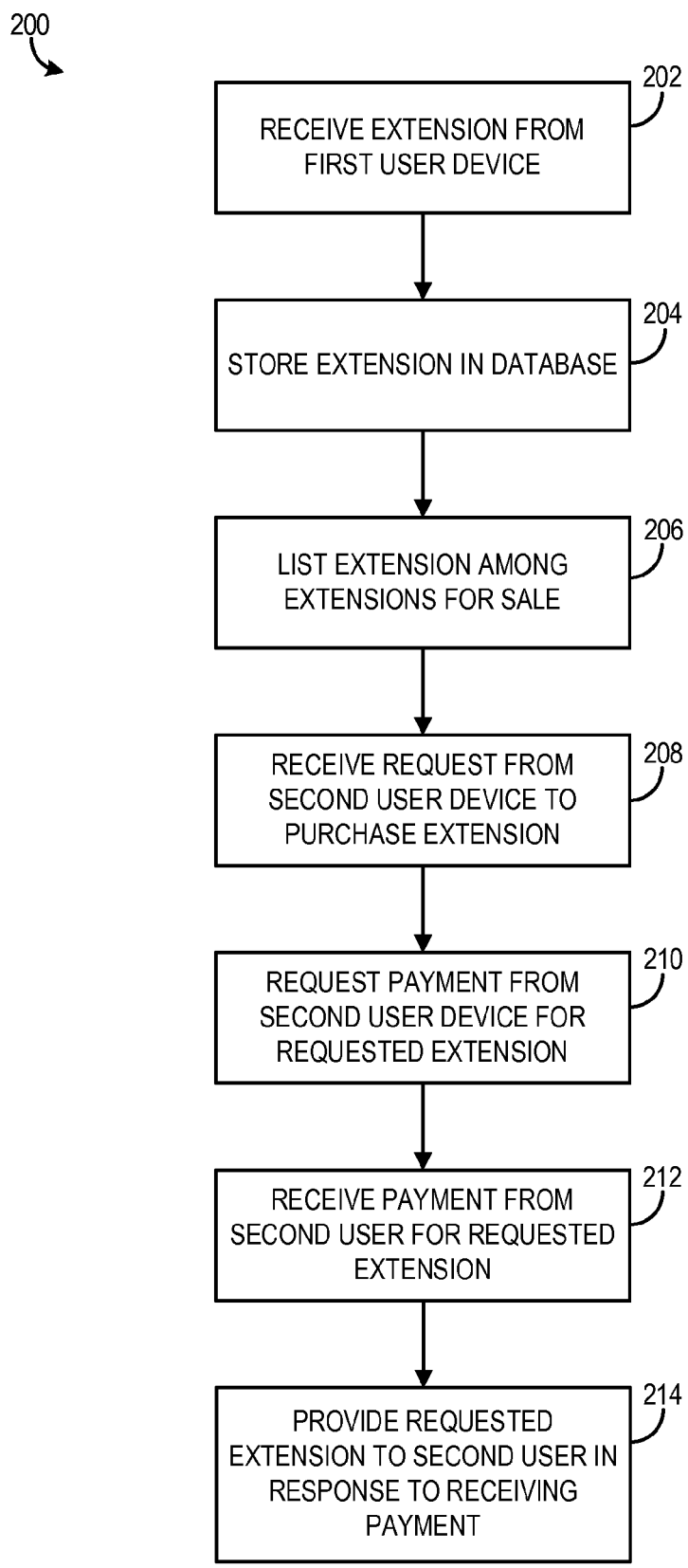
FIG. 9 is a flow chart depicting yet another method of distributing a functional extension according to presently described embodiments.

In any event, FIG. 9 is a flow chart depicting a method 200 for distributing a functional extension from an online store. In the method 200, the server 40 receives the extension from a first user (e.g., the operator of the client device 12) (block 202). The server 40 stores the extension as one of the extensions 52 in the database 50 (block 204). The extension 52 is listed among the extensions for sale (block 206), such that other users may locate the extension 52 and choose to download it. Thereafter, the server 40 may receive a request from a second device (e.g., the client device 14) to purchase the extension 52 (block 208). The server 40 may send a request for payment from the operator of the second device for the requested extension (block 210) and, in response to the request for payment, may receive payment from the operator of the second device (block 212). In response to receiving the payment for the requested extension 52, the server 40 may provide the requested extension to the second device (block 214).

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

While embodiments above are described as related to a 3D modeling software, the structures and functionality presented with respect to the 3D modeling software may be applied to any modeling software. Accordingly, the claims are not intended to be limited to a 3D modeling software unless explicitly recited therein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for efficient distribution of functional extensions to a 3D modeling software through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method in a network server for extending functionality of three-dimensional (3D) modeling software, the method comprising:

receiving a functional extension to the 3D modeling software from a first client device via a communication network, wherein (i) the functional extension includes computer-readable instructions compatible with the 3D modeling software, (ii) the functional extension includes an identifier of a first user, and (iii) the functional extension provides a modeling function not provided by the 3D modeling software;

storing the functional extension in a database and updating a record associated with the first user in a client profile server to associate the received functional extension with the first user, wherein the record associated with the first user includes a list of functional extensions currently installed on the first client device and a list of extensions created by the first user, wherein the list of functional extensions currently installed on the first client device and the list of extensions created by the first user are different;

receiving from a second client device, via the communication network, a request to provide the functional extension; and in response to receiving the request, providing the functional extension to the second client device.

2. The method of claim 1, wherein receiving the functional extension includes receiving a plurality of non-compiled instructions interpretable at runtime.

3. The method of claim 2, wherein:

the modeling software includes an application programming interface (API) that provides access to a plurality of functions of the 3D modeling software, and the plurality of non-compiled instructions include a call to the API.

4. The method of claim 1, wherein receiving a request to provide the functional extension from a second client device via the communication network comprises:

receiving from the second client device the identifier of the first user.

5. The method of claim 4, wherein receiving a request to provide the functional extension from a second client device via the communication network comprises:

in response to receiving from the second client device the identifier of the first user, sending to the second device a list of extensions associated with the first user; and receiving a request for the functional extension.

6. The method of claim 4, wherein receiving a request to provide the functional extension from a second client device via the communication network comprises:

in response to receiving from the second client device the identifier of the first user, requesting a list of extensions currently installed on the second device;

receiving the list of extensions currently installed on the second device;

comparing the list of extensions currently installed on the second device to the record associated with the first user in the client profile server; and determining that the functional extension is not installed on the second client device.

7. The method of claim 1, wherein the 3D modeling software operates as a plug-in within a browser application.

8. A method in a network server for extending functionality of three-dimensional (3D) modeling software, the method comprising:

receiving a functional extension to the 3D modeling software from a first client device operated by a registered user via a communication network, wherein (i) the functional extension includes computer-readable instructions compatible with the 3D modeling software, (ii) the functional extension provides a modeling function not provided by the 3D modeling software, and (iii) the functional extension is installed on the first client device;

storing the functional extension in a database;

updating a record associated with the registered user in a profile server, including storing an indication that the functional extension was received from the registered user and that the functional extension has been installed on the first client device;

receiving an indication that the registered user is operating a second client device;

in response to receiving the indication that the registered user is operating the second client device, requesting a list of extensions currently installed on the second client device;

receiving the list of extensions currently installed on the second client device;

comparing the list of extensions currently installed on the second client device to the record associated with the first user in the profile server;

determining that the functional extension is not installed on the second client device;

and providing the functional extension to the second client device.

9. The method of claim 8, wherein:

the 3D modeling software operates as a plug-in within a browser application, and the functional extension is a script interpreted at runtime within the browser application.

10. The method of claim 8, further comprising providing the functional extension to a second user operating a third client device in response to receiving a request for the functional extension from the second user.

11. The method of claim 8, further comprising:

in response to receiving the indication that the registered user is operating the second client device, sending to the second device a list of extensions associated with the first user.

12. A tangible, computer-readable medium storing instructions, executable by a processor to perform a method in a network server for extending functionality of three-dimensional (3D) modeling software, the instructions operable to cause the processor to:

receive a functional extension to the 3D modeling software from a first client device via a communication network, wherein (i) the functional extension includes computer-readable instructions compatible with the 3D modeling software, (ii) the functional extension includes an identifier of a first user, and (iii) the functional extension provides a modeling function not provided by the 3D modeling software;

store the functional extension in a database and update a record associated with the first user in a client profile server to associate the received functional extension with the first user, wherein the record associated with the first user includes a list of functional extensions currently installed on the first client device;

receive from a second client device, via the communication network, a request to provide the functional extension; and in response to receiving the request, providing the functional extension to the second client device.

13. The computer-readable medium of claim 12, wherein instructions operable to cause the processor to receive the functional extension include instructions operable to cause the processor to receive a plurality of non-compiled instructions interpretable at runtime.

14. The computer-readable medium of claim 13, wherein:

the 3D modeling software includes an application programming interface (API) that provides access to a plurality of functions of the 3D modeling software, and the plurality of non-compiled instructions include a call to the API.

15. The computer-readable medium of claim 12, wherein the instructions operable to cause the processor to receive a request to provide the functional extension from a second client device via the communication network comprise instructions operable to cause the processor to receive from the second client device the identifier of the first user.

16. The computer-readable medium of claim 15, wherein the instructions operable to cause the processor to receive a request to provide the functional extension from a second client device via the communication network comprise instructions operable to cause the processor to:
in response to receiving from the second client device the identifier of the first user, send to the second device a list of extensions associated with the first user; and
receive a request for the functional extension.

17. The computer-readable medium of claim 15, wherein the instructions operable to cause the processor to receive a request to provide the functional extension from a second client device via the communication network comprise instructions operable to cause the processor to:
in response to receiving from the second client device the identifier of the first user, request a list of extensions currently installed on the second client device;
receive the list of extensions currently installed on the second client device;
compare the list of extensions currently installed on the second client device to the record associated with the first user in the client profile server; and
determine that the functional extension is not installed on the second client device.

18. The computer-readable medium of claim 12, wherein the 3D modeling software operates as a plug-in within a browser application.

19. A tangible, computer-readable medium storing instructions, executable by a processor to perform a method in a network server for extending functionality of three-dimensional (3D) modeling software, the instructions operable to cause the processor to:
receive a functional extension to the 3D modeling software from a first client device operated by a registered user via a communication network, wherein (i) the functional extension includes computer-readable instructions compatible with the 3D modeling software, (ii) the functional extension provides a modeling function not provided by the 3D modeling software, and (iii) the functional extension is installed on the first client device;
store the functional extension in a database;
update a record associated with the registered user in a profile server, including storing an indication that the functional extension was received from the registered user and that the functional extension has been installed on the first client device;
receive an indication that the registered user is operating a second client device;
in response to receiving the indication that the registered user is operating the second client device, send to the second device a list of extensions associated with the first user;
receive a request for the functional extension; and
provide the functional extension to the second client device.

20. The computer-readable medium of claim 19, wherein:
the 3D modeling software operates as a plug-in within a browser application, and the functional extension is a script interpreted at runtime within the browser application.

21. The computer-readable medium of claim 19, further comprising instructions operable to cause the processor to provide the functional extension to a second user operating a third client device in response to receiving a request for the functional extension from the second user.

22. The computer-readable medium of claim 19, further comprising instructions operable to cause the processor to:
in response to receiving the indication that the registered user is operating the second client device, request a list of extensions currently installed on the second device;
receive the list of extensions currently installed on the second device; and
compare the list of extensions currently installed on the second device to the record associated with the first user in the profile server.

23. A method in a network server for extending functionality of three-dimensional (3D) modeling software, the method comprising:
storing in a database a functional extension to the 3D modeling software, wherein (i) the functional extension includes computer-readable instructions compatible with the 3D modeling software, and (ii) the functional extension provides a modeling function not provided by the 3D modeling software;
receiving a request from a first client device operated by a first user to provide the functional extension via the communication network;
receiving a list of extensions currently installed on the first client device;
comparing the list of extensions currently installed on the first client device to a record associated with the first user;
determining that the functional extension is not in the list of extensions currently installed on the first client device;
providing the functional extension to the first client device;
receiving a list of extensions currently installed on the second client device;
comparing the list of extensions currently installed on the second client device to the record associated with the first user;
determining that the functional extension is not in the list of extensions currently installed on the second client device; and
providing the functional extension to the second client device operated by the first user.

24. The method of claim 23, further comprising:
receiving from the first client device an identifier of the first user; and
updating a record associated with the first user in a client profile server to associate the received functional extension with the first user.

25. The method of claim 24, further comprising:
receiving an indication that the first user has installed the functional extension on the first client device; and
updating the record associated with the first user in the client profile server to reflect that the functional extension is installed on the first client device.

26. The method of claim 24, further comprising:
receiving from the second client device the identifier of the first user.

27. The method of claim 23, wherein the functional extension includes receiving a plurality of non-compiled instructions interpretable at runtime.

28. The method of claim 27, wherein:
the 3D modeling software includes an application programming interface (API) that provides access to a plurality of functions of the 3D modeling software, and
the plurality of non-compiled instructions include a call to the API.

29. The method of claim 23, wherein the 3D modeling software operates as a plug-in within a browser application.

30. The method of claim 23, wherein providing the functional extension to the second client device operated by the first user comprises:
sending to the second device a list of extensions associated with the first user.

31. The method of claim 23, wherein providing the functional extension to the second client device operated by the first user comprises:

requesting a list of extensions currently installed on the second client device.

\* \* \* \* \*